(12) United States Patent
Bae et al.

(10) Patent No.: US 8,921,441 B2
(45) Date of Patent: Dec. 30, 2014

(54) THERMALLY RESISTANT OPTICAL SILOXANE RESIN COMPOSITION

(71) Applicant: Korea Advanced Institute of Science and Technology, Daejeon (KR)

(72) Inventors: Byeong-soo Bae, Daejeon (KR); Seungcheol Yang, Daejeon (KR); Jun-young Bae, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 13/779,914

(22) Filed: Feb. 28, 2013

(65) Prior Publication Data

US 2013/0225711 A1    Aug. 29, 2013

(30) Foreign Application Priority Data

Feb. 28, 2012    (KR) ........................ 10-2012-0020155

(51) Int. Cl.
| | | |
|---|---|---|
| *C08G 59/68* | (2006.01) | |
| *C08F 2/50* | (2006.01) | |
| *C08F 2/46* | (2006.01) | |
| *A61L 2/08* | (2006.01) | |
| *A61L 24/00* | (2006.01) | |
| *C08G 61/04* | (2006.01) | |
| *C08K 5/524* | (2006.01) | |
| *C08K 5/134* | (2006.01) | |
| *C08K 5/375* | (2006.01) | |
| *C08G 77/14* | (2006.01) | |
| *C08K 5/00* | (2006.01) | |
| *C08K 5/5435* | (2006.01) | |

(52) U.S. Cl.
CPC ............... *C08K 5/524* (2013.01); *C08K 5/1345* (2013.01); *C08K 5/375* (2013.01); *C08G 77/14* (2013.01); *C08K 5/005* (2013.01); *C08K 5/5435* (2013.01)
USPC .......... 522/31; 522/6; 522/1; 522/71; 522/189; 522/184; 520/1

(58) Field of Classification Search
USPC ................... 522/31, 6, 1, 71, 189, 184; 520/1
See application file for complete search history.

(56) References Cited

U.S. PATENT DOCUMENTS

2008/0045619 A1 *   2/2008   Jackson et al. .................. 522/32
2010/0025724 A1 *   2/2010   Bae et al. ...................... 257/100

FOREIGN PATENT DOCUMENTS

| KR | 10-0980270 A | 2/2010 |
| KR | 10-2010-0073847 A | 7/2010 |

\* cited by examiner

*Primary Examiner* — Ling Choi
*Assistant Examiner* — Jessica E Whiteley
(74) *Attorney, Agent, or Firm* — Pearne & Gordon LLP

(57) ABSTRACT

The present disclosure relates to a thermally resistant optical siloxane resin composition including siloxane containing photo-cationically polymerizable epoxy group, a photo initiator, and an antioxidant.

18 Claims, No Drawings

THERMALLY RESISTANT OPTICAL SILOXANE RESIN COMPOSITION

CROSS-REFERENCE TO RELATED APPLICATION

This application claims the benefit of Korean Patent Application No. 10-2012-0020155 filed on Feb. 28, 2012, the entire disclosures of which are incorporated herein by reference.

FIELD OF THE INVENTION

The present disclosure relates to a thermally resistant optical siloxane resin composition including siloxane containing photo-cationically polymerizable epoxy group, a photo initiator, and an antioxidant.

BACKGROUND OF THE INVENTION

A photocuring process with acrylate or epoxide is a rapid process consuming little energy at low process temperature and low costs, and, thus, it has been employed in various fields of industry including the optical field and the display field. However, a transparent polymer produced by the photocuring process with acrylate or epoxide has a low thermal resistance to yellowing due to non-existence of siloxane having a high thermal resistance to yellowing and an oxidation reaction of a hydrocarbon backbone constituting the polymer. The transparent polymer produced by the photocuring process with acrylate or epoxide is not applicable to the optical field and the display field as, for example, a LED encapsulant requiring a high thermal resistance to yellowing.

Although Korean Patent Publication No. 10-2010-0073847 describes an acrylate-adhesive resin composition and photocurable adhesive composition including the same, the photocurable adhesive composition does not have a high thermal resistance to yellowing.

Thus, there has been an increasing demand for a thermally resistant optical siloxane resin used for producing cured transparent siloxane having a siloxane bond with a high thermal resistance to yellowing.

BRIEF SUMMARY OF THE INVENTION

In view of the foregoing, the present disclosure provides a thermally resistant optical siloxane resin composition including a siloxane containing photo-cationically polymerizable epoxy group, a photo initiator, and an antioxidant, and further provides cured transparent siloxane produced by photo-cationically polymerizing the composition.

However, problems to be solved by the present disclosure may not be limited to the above-described problems. Although not described herein, other problems to be solved by the present disclosure can be clearly understood by those skilled in the art from the following description.

In accordance with a first aspect of the present disclosure, there is provided a thermally resistant optical siloxane resin composition including siloxane containing photo-cationically polymerizable epoxy group; a photo initiator; and an antioxidant.

In accordance with an illustrative embodiment, the siloxane containing photo-cationically polymerizable epoxy group is produced through a sol-gel reaction.

In accordance with an illustrative embodiment, the siloxane containing photo-cationically polymerizable epoxy group is produced through a sol-gel reaction of alkoxysilane containing an epoxy group.

In accordance with an illustrative embodiment, the alkoxysilane containing epoxy group includes a structure represented by [Chemical formula 1]:

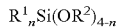 [Chemical formula 1]

wherein $R_1$ denotes an epoxy group or an alicyclic epoxy group; $R^2$ denotes a linear or branched ($C_1$ to $C_7$)alkyl group; and n denotes an integer of 1 to 3.

In accordance with an illustrative embodiment, the alkoxysilane or silanol includes a structure represented by [Chemical formula 2]:

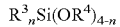 [Chemical formula 2]

wherein $R^3$ denotes ($C_1$ to $C_{20}$)alkyl group, ($C_2$ to $C_{20}$) alkenyl group, ($C_2$ to $C_{20}$)alkinyl group or ($C_6$ to $C_{20}$) aryl group which may have a substituent selected from Group A; $R^4$ denotes linear or branched ($C_1$ to $C_7$)alkyl group or hydrogen; and n denotes an integer of 1 to 3:

<Group A>
($C_1$ to $C_{20}$)alkyl group, ($C_3$ to $C_8$)cycloalkyl group, acryl group, methacryl group, allyl group, halogen group, amino group, mercapto group, ether group, ester group, ($C_1$ to $C_{20}$) alkoxy group, sulfone group, nitro group, hydroxy group, cyclobutene group, carbonyl group, carboxylic group, alkyd group, urethane group, vinyl group, nitrile group, oxetane group, phenyl group, and combinations thereof.

In accordance with an illustrative embodiment, the photo initiator includes an onium salt and/or an organometallic salt.

In accordance with an illustrative embodiment, the antioxidant is selected from the group consisting of a phenolic-based antioxidant, a phosphate-based antioxidant, an aminic-based antioxidant, a thioester-based antioxidant, and combinations thereof.

In accordance with an illustrative embodiment, the sol-gel reaction is performed with a catalyst selected from the group consisting of an acidic catalyst, a basic catalyst, an ion exchange resin, metal hydroxide catalyst, and combinations thereof.

In accordance with an illustrative embodiment, the thermally resistant optical siloxane resin composition further includes a monomer containing photo-cationically polymerizable functional group.

In accordance with a second aspect of the present disclosure, there is provided a method for producing cured transparent siloxane, including photo-cationic polymerization of a thermally resistant optical siloxane resin composition of the first aspect of the present disclosure.

In accordance with an illustrative embodiment, a thermal treatment after the photo-cationic polymerization.

In accordance with a third aspect of the present disclosure, there is provided cured transparent siloxane produced by a method of the second aspect of the present disclosure.

In accordance with the present disclosure, a cured transparent siloxane produced by photo-cationically polymerizing a thermally resistant optical siloxane resin composition including a siloxane containing photo-cationically polymerizable epoxy group produced through a sol-gel reaction, a photo initiator for photo-cationic polymerization, and an antioxidant has excellent characteristics such as a high light-transmittance, an excellent thermal resistance to yellowing, a high productivity through a photocuring process, a high refractive index, and a high hardness, and, thus, it can be widely applied to the optical field and the display field as a LED encapsulant or the like.

DETAILED DESCRIPTION OF THE INVENTION

Hereinafter, illustrative embodiments and examples of the present disclosure will be described in detail with reference to the accompanying drawings so that the present disclosure may be readily implemented by those skilled in the art.

However, it is to be noted that the present disclosure may not be limited to the embodiments and examples.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the another element and a case that any other element exists between these two elements.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise.

The term "about or approximately" or "substantially" are intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, "A and/or B" includes "A, B or, A and B".

Hereinafter, illustrative embodiments and examples of a thermally resistant optical siloxane resin composition of the present disclosure and cured transparent siloxane produced by photo-cationically polymerizing the optical siloxane resin composition will be explained in detail. However, the present disclosure may not be limited to the following illustrative embodiments and examples.

In accordance with a first aspect of the present disclosure, there is provided a thermally resistant optical siloxane resin composition including a siloxane containing photo-cationically polymerizable epoxy group, a photo initiator, and an antioxidant.

The siloxane containing photo-cationically polymerizable epoxy group may be produced through, but not limited to, a sol-gel reaction. By way of example, the siloxane containing photo-cationically polymerizable epoxy group may be produced through, but not limited to, a sol-gel reaction of sole alkoxysilane containing an epoxy group. Further, by way of example, the siloxane containing photo-cationically polymerizable epoxy group may be produced through, but not limited to, a sol-gel reaction between alkoxysilane or silanol and alkoxysilane containing an epoxy group. The following [Reaction scheme 1] to [Reaction scheme 3] represent typical sol-gel reactions for producing siloxane containing photo-cationically polymerizable epoxy group.

The following [Reaction scheme 1] and [Reaction scheme 2] schematically show a hydrolysis-condensation reaction of alkoxysilane in the presence of water (hydrolyzable sol-gel reaction).

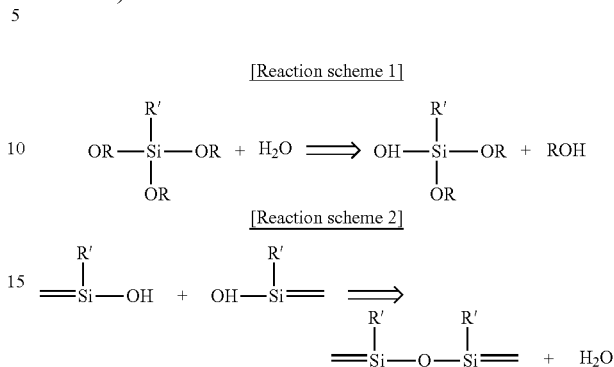

As shown from [Reaction scheme 1] and [Reaction scheme 2] above, an alkoxy group of the alkoxysilane as a starting material is hydrolyzed with water to produce a hydroxy group, and then this hydroxy group is linked to an alkoxy group or a hydroxy group of another monomer through a condensation reaction to form a siloxane bond.

A sol-gel reaction in the following [Reaction scheme 3] schematically shows a condensation reaction between hydroxy group-containing silanol and alkoxy group-containing alkoxysilane without addition of water (non-hydrolyzable sol-gel reaction).

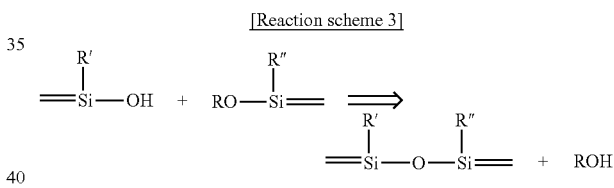

As can be seen from [Reaction scheme 3] above, a hydroxy group of the silanol and an alkoxy group of the alkoxysilane as starting materials are lined to each other by a siloxane bond through a condensation reaction.

In order to promote the hydrolyzable sol-gel reaction, a catalyst may be added, but the present disclosure may not be limited thereto. As a usable catalyst, an acidic catalyst, for example, but not limited to, acetic acid, phosphoric acid, sulfuric acid, hydrochloric acid, nitric acid, chlorosulfonic acid, para-toluic acid, trichloroacetic acid, polyphosphoric acid, phyllophosphoric acid, iodic acid, tartaric acid, perchloric acid, or the like, a basic catalyst, for example, but not limited to, ammonia, sodium hydroxide, n-butyl amine, di-n-butyl amine, tri-n-butyl amine, imidazole, ammonium perchlorate, potassium hydroxide, barium hydroxide, or the like, or an ion exchange resin, for example, but not limited to, Amberite IPA-400 (Cl) or the like may be used. Although the added amount of the catalyst is not particularly limited, about 0.0001 part by weight to about 10 parts by weight thereof based on about 100 parts by weight of alkoxysilane may be added, but the present disclosure may not be limited thereto. The sol-gel reaction may be carried out with stirring, for example, but not limited to, at a room temperature for about 6 hours to about 144 hours. In order to increase a reaction rate and perform a complete condensation reaction, the sol-gel reaction may be carried out by inducing the hydrolysis-condensation reaction at from about 0° C. to about 100° C., from about 10° C. to about 90° C., from about 20° C. to about 80° C., from about 30° C. to about 80° C., from about 40° C. to about 80° C., from about 50° C. to about 80° C., and desirably from about 60° C. to about 80° C. for about 24 hours. Thus, the siloxane containing photo-cationically polymerizable epoxy group can be produced.

The siloxane containing photo-cationically polymerizable epoxy group produced through the hydrolysis-condensation reaction includes alcohol as a byproduct and water remaining after the reaction, which can be removed by being left at about 0° C. to about 120° C. under atmospheric pressure or reduced pressure and under the condition of about −0.1 MPa for about 30 minutes.

In order to decrease a reaction temperature of the non-hydrolyzable sol-gel reaction and promote the reaction, a catalyst may be added, but the present disclosure may not be limited thereto. As a usable catalyst, metal hydroxide, for example, but not limited to, barium hydroxide, strontium hydroxide, or the like may be used. Although the added amount of the catalyst is not particularly limited, about 0.0001 part by weight to about 10 parts by weight thereof based on about 100 parts by weight of silane may be added, but the present disclosure may not be limited thereto. The sol-gel reaction may be carried out with stirring, for example, but not limited to, at a room temperature for about 2 hours to about 72 hours. In order to increase a reaction rate and perform a complete condensation reaction, the sol-gel reaction may be carried out by inducing the hydrolysis-condensation reaction at from about 0° C. to about 100° C., from about 10° C. to about 90° C., from about 20° C. to about 80° C., from about 30° C. to about 80° C., from about 40° C. to about 80° C., from about 50° C. to about 80° C., and desirably from about 60° C. to about 80° C. for about 4 hours. Thus, the siloxane containing photo-cationically polymerizable epoxy group can be produced.

The alkoxysilane containing photo-cationically polymerizable epoxy group may include, but may not be limited to, a structure represented by the following [Chemical formula 1]:

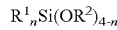   [Chemical formula 1]

wherein $R^1$ denotes an epoxy group or an alicyclic epoxy group; $R^2$ denotes linear or branched ($C_1$ to $C_7$)alkyl; and n denotes an integer of 1 to 3.

By way of example, the alkoxysilane containing photo-cationically polymerizable epoxy group may be selected from, but not limited to, the group consisting of 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, and combinations thereof.

The alkoxysilane or silanol may include, but may not be limited to, a structure represented by the following [Chemical formula 2]:

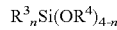   [Chemical formula 2]

wherein $R^3$ denotes ($C_1$ to $C_{20}$)alkyl, ($C_2$ to $C_{20}$)alkenyl, ($C_2$ to $C_{20}$)alkinyl or ($C_6$ to $C_{20}$)aryl which may have a substituent selected from the following Group A; $R^4$ denotes linear or branched ($C_1$ to $C_7$)alkyl or hydrogen; and n denotes an integer of 1 to 3:
  <Group A>
  a ($C_1$ to $C_{20}$)alkyl group, ($C_3$ to $C_8$)cycloalkyl group, acryl group, methacryl group, allyl group, halogen group, amino group, mercapto group, ether group, ester group, ($C_1$ to $C_{20}$) alkoxy group, sulfone group, nitro group, hydroxy group, cyclobutene group, carbonyl group, carboxylic group, alkyd group, urethane group, vinyl group, nitrile group, oxetane group, phenyl group, and combinations thereof.

By way of example, the alkoxysilane or silanol may be selected from, but not limited to, the group consisting of triphenylsilanol, phenyltrisilanol, diphenylsilanediol, diisobutylsilanediol, triphenylmethoxysilane, triphenylethoxysilane, phenyltrimethoxysilane, phenyltriethoxysilane, diphenyldimethoxysilane, diphenyldiethoxysilane, diisobutyldimethoxysilane, diisobutyldiethoxysilane, tetramethoxysilane, tetraethoxysilane, methyltrimethoxysilane, methyltriethoxysilane, methyltripropoxysilane, propylethyltrimethoxysilane, ethyltriethoxysilane, vinyltrimethoxysilane, vinyltriethoxysilane, vinyltripropoxysilane, N-(3-acryloxy-2-hydroxypropyl)-3-aminopropyltriethoxysilane, N-(3-acryloxy-2-hydroxypropyl)-3-aminopropyltrimethoxysilane, N-(3-acryloxy-2-hydroxypropyl)-3-aminopropyltripropoxysilane, 3-acryloxypropylmethylbis(trimethoxy)silane, 3-acryloxypropyltrimethoxysilane, 3-acryloxypropyltriethoxysilane, 3-acryloxypropyltripropoxysilane, 3-(meth)acryloxypropyltrimethoxysilane, 3-(meth)acryloxypropyltriethoxysilane, (meth)acryloxypropyltripropoxysilane, N-(aminoethyl-3-aminopropyl)trimethoxysilane, N-(2-aminoethyl-3-aminopropyl)triethoxysilane, 3-aminopropyltrimethoxysilane, 3-aminopropyltriethoxysilane, chloropropyltrimethpxysilane, chloropropyltriethoxysilane, heptadecafluordecyltrimethoxysilane, and combinations thereof.

The photo initiator for photo-cationic polymerization may include, for example, but not limited to, an onium salt, an organometallic salt, or the like. By way of example, a diaryliodonium salt, a triarylsulfonium salt, an aryldiazonium salt, an iron-arene complex, or the like may be used, but the present disclosure may not be limited thereto. The photo initiator for photo-cationic polymerization may be selected from, but not limited to, the group consisting of arylsulfonium hexafluoroantimonium salt, arylsulfonium hexafluorophosphate salt, diphenyliodonium hexafluorophosphate salt, diphenyliodonium hexaantimonium salt, ditolyliodonium hexafluorophosphate salt, 9-(4-hydroxyethoxyphenyl)thianthrenium hexafluorophosphate salt, and combinations thereof.

The added amount of the photo initiator for photo-cationic polymerization may be, but may not be limited to, about 0.1 parts by weight to about 10 parts by weight thereof, about 1 part by weight to about 8 parts by weight thereof or about 3 parts by weight to about 6 parts by weight thereof based on about 100 parts by weight of the siloxane containing photo-cationically polymerizable epoxy group produced through the sol-gel reaction.

The antioxidant for suppressing an oxidation reaction caused by the photo initiator for photo-cationic polymerization may be selected from, for example, but not limited to, the group consisting of a phenolic-based antioxidant, a phosphate-based antioxidant, an aminic-based antioxidant, a thioester-based antioxidant, and combinations thereof. The phenolic-based antioxidant may be selected from, for example, but not limited to, the group consisting of tetrakis [methylene-3-(3,5-di-tert-butyl-4-hydroxyphenyl)propionate]methane, 1,2-bis(3,5-di-tert-butyl-4-hydroxyhydro cinnamoyl)hydrazine, thiodiethylene bis[3-(3,5-di-tert-butyl-4-hydroxyphenyl)propionate], octadecyl-3-(3,5-di-tert-butyl-4-hydroxyphenyl)propionate, isotridecyl-3-(3,5-di-tert-butyl-4-hydroxyphenyl)propionate, N,N'-hexamethylenebis(3,5-di-tert-butyl-4-hydroxyhydro cinnamamide), benzenepropanoic acid, 3,5-bis(1,1-dimethylethyl)-4-hydroxy-, $C_{7-9}$-branched alkyl ester, 2,2'-ethylidenebis(4,6-di-tert-butylphenol), 1,3,5-trimethyl-2,4,6- tris(3,5-di-tert-butyl-4-hydroxybenzyl)benzene, 4,6-bis(octylthiomethyl)-o-cresol, 1,3,5-tris(2,6-dimethyl-3-hydroxy-4-tert-butylbenzyl)isocyanurate, 2,2'-methylenebis(4-methyl-6-tert-butylphenol), triethylen glycol-bis-3-(3-tert-butyl-4-hydroxy-5-methylphenyl)propionate, 2,5-di-tert-amyl-hydroquinone, hexamethylenebis[3-(3,5-di-tert-butyl-4-hydroxyphenyl)propionate], tris-(3,5-di-tert-butylhydroxybenzyl)isocyanurate, 4,4'-thiobis(6-tert-butyl-m-cresol), 4,4'-butylidenebis(6-tert-3-methylphenol), and combinations thereof. The phosphate-based antioxidant may be selected from, for example, but not limited to, the group consisting of tris(2,4-di-tert-butylphenyl)nonyl, distearyl pentaerythritol dinonyl, bis(2,4-di-tert-butylphenyl)pentaerythritol dinonyl, triphenyl nonyl, triisodecyl nonyl, diphenylisodecyl nonyl, 2-ethylhexyl diphenyl nonyl, poly(diprophylene glycol)phenyl nonyl, tris(nonylphenyl)nonyl, and combinations thereof. The aminic-based antioxidant may be, for example, but not limited to, 2,2,4-trimethyl-1,2-dihydroquinoline oligomer. The thioester-based antioxidant may be selected from, for example, but not limited to, the group consisting of pentaerythrityl tetrakis(3-lauryl thiopropionate), distearyl thiodipropionate, dilauryl thiodipropionate, ditridecyl thiodipropionate, and combinations thereof.

Desirably, the added amount of the antioxidant may be, for example, about 0.1 parts by weight to about 10 parts by weight thereof based on about 100 parts by weight of the siloxane containing photo-cationically polymerizable epoxy group produced through the sol-gel reaction. If the added amount of the antioxidant is less than about 0.1 part by weight, the cured transparent siloxane produced by photo-cationically polymerizing the thermally resistant optical siloxane resin composition has a low thermal resistance to yellowing, and if the added amount of the antioxidant is more than about 10 parts by weight, it is possible to reduce a thermal resistance to yellowing of the cured transparent siloxane caused by oxidation of the antioxidant itself. The added amount of the antioxidant may be, for example, but not limited to, about 0.1 parts by weight to about 10 parts by weight thereof, about 1 parts by weight to about 8 parts by weight thereof or about 3 parts by weight to about 6 parts by weight thereof based on about 100 parts by weight of the siloxane containing photo-cationically polymerizable epoxy group produced through the sol-gel reaction.

In order to control a viscosity of the produced siloxane containing photo-cationically polymerizable epoxy group and increase a speed of photocuring process reduced due to a high viscosity, a monomer containing photo-cationically polymerizable functional group may be added to the thermally resistant optical siloxane resin composition, but the present disclosure may not be limited thereto. Desirably, the amount of the monomer containing photo-cationically polymerizable functional group to be added to the thermally resistant optical siloxane resin composition may be about 0.1 parts by weight to about 100 parts by weight thereof based on about 100 parts by weight of the siloxane containing photo-cationically polymerizable epoxy group produced through the sol-gel reaction. If the added amount of the monomer is more than about 100 parts by weight, the specific gravity of hydrocarbon of the cured transparent siloxane produced by photo-cationically polymerizing the siloxane resin composition increases, which may result in a decrease in a thermal resistance to yellowing.

By way of example, the photo-cationically polymerizable functional group may include, but may not be limited to, epoxy group, cyclic ether group such as oxetane group, or vinyl ether group and the like.

The cured transparent siloxane can be produced by photo-cationically polymerizing the thermally resistant optical siloxane resin composition. The cured transparent siloxane has a high thermal resistance to yellowing.

After photo-cationically polymerizing the thermally resistant optical siloxane resin composition, a thermal treatment may be further performed to produce the cured transparent siloxane, but the present disclosure may not be limited thereto. Through the thermal treatment, it is possible to produce the cured transparent siloxane having a uniform curing density due to living characteristics of photo-cationic polymerization. The thermal treatment may be performed at a temperature of, for example, but not limited to, from about 50° C. or more to about 250° C. or less, from about 50° C. or more to about 200° C. or less, or from about 50° C. or more to about 150° C. or less. If the thermal treatment is performed at a high temperature of more than about 250° C., bonding chains between organic functional groups may be broken, and if the thermal treatment is performed at a low temperature of less than about 50° C., the living characteristics of the photo-cationic polymerization may not be well expressed.

The present disclosure will be explained in detail with reference to the following examples. However, these examples are provided for illustration but do not limit the technical scope of the present disclosure.

EXAMPLE

Example 1

2-(3,4-epoxycyclohexyl)ethyltrimethoxysilane (ECTMS, Gelest Company):diphenylsilanediol (DPSD, Gelest Company) were mixed at a ratio of 12.32 g:10.82 g (0.05 mol:0.05 mol) and then put into a 100 ml 2-neck flask. Thereafter, 0.02 g (0.1 mol % based on silane) of barium hydroxide as a catalyst was added to the mixture and stirred at about 80° C. for about 4 hours under $N_2$ (nitrogen) purge. A resin obtained after a sol-gel reaction for about 4 hours was filtered by using a 0.45 μm Teflon filter and an alicyclic epoxy siloxane resin was obtained. Then, 3-ethyl-3[[3-ethyloxetan-3-yl]methoxy]methylloxetane was added in about 20 parts by weight based on the resin, and an arylsulfonium hexafluoroantimonium salt as a photo initiator for photo-cationic polymerization was added in about 1.2 parts by weight based on the mixed resin. Thereafter, iso-octyl-3-(3,5-di-tert-butyl-4-hydroxyphenyl)propionate and tris(nonylphenyl)phosphite as antioxidants for suppressing an oxidation reaction caused by the photo initiator were added in about 1.35 parts by weight and about 3.6 parts by weight, respectively, based on the resin. After stirring for about 3 hours, a sample was photocured by being exposed to a UV lamp at about 365 nm wavelength for about 1 minute. After the photocuring process, a thermal curing process was performed to the sample at a temperature of about 120° C. for about 30 minutes.

Example 2

2-(3,4-epoxycyclohexyl)ethyltrimethoxysilane (ECTMS, Gelest Company):diphenylsilanediol (DPSD, Gelest Company) were mixed at a ratio of 12.32 g:10.82 g (0.05 mol:0.05 mol) and then put into a 100 ml 2-neck flask. Thereafter, 0.02 g (0.1 mol % based on silane) of barium hydroxide as a catalyst was added to the mixture and stirred at about 80° C. for about 4 hours under $N_2$ (nitrogen) purge. A resin obtained after a sol-gel reaction for about 4 hours was filtered by using a 0.45 μm Teflon filter and an alicyclic epoxy siloxane resin was obtained. Then, 3-ethyl-3[[3-ethyloxetan-3-yl]methoxy]

methylloxetane was added in about 20 parts by weight based on the resin, and an arylsulfonium hexafluoroantimonium salt as a photo initiator for photo-cationic polymerization was added in about 1.2 parts by weight based on the mixed resin. Thereafter, thiodiethylene bis[3-(3,5-di-tert-butyl-4-hydroxyphenyl)propionate as an antioxidant for suppressing an oxidation reaction caused by the photo initiator was added in about 2.0 parts by weight based on the resin. After stirring for about 3 hours, a sample was photocured by being exposed to a UV lamp at about 365 nm wavelength for about 1 minute. After the photocuring process, a thermal curing process was performed to the sample at a temperature of about 120° C. for about 30 minutes.

Example 3

3-glycidoxypropyltrimethoxysilane (GPTMS, Gelest Company):diphenylsilanediol (DPSD, Gelest Company) were mixed at a ratio of 11.82 g:10.82 g (0.05 mol:0.05 mol) and then put into a 100 ml 2-neck flask. Thereafter, 0.02 g (0.1 mol % based on silane) of barium hydroxide as a catalyst was added to the mixture and stirred at about 80° C. for about 4 hours under $N_2$ (nitrogen) purge. A resin obtained after a sol-gel reaction for about 4 hours was filtered by using a 0.45 μm Teflon filter and an epoxy siloxane resin was obtained. Then, 3,4-epoxycyclohexylmethyl 3,4-epoxycyclohexane carboxylate was added in about 15 parts by weight based on the resin, and a diphenyldiodonium hexafluoroantimonium salt as a photo initiator for photo-cationic polymerization was added in about 2.0 parts by weight based on the mixed resin. Thereafter, isotridecyl-3-(3,5-di-tert-butyl-4-hydroxyphenyl)propionate and triphenyl phosphite as antioxidants for suppressing an oxidation reaction caused by the photo initiator were added in about 1.2 parts by weight and about 3.0 parts by weight, respectively, based on the resin. After stirring for about 3 hours, a sample was photocured by being exposed to a UV lamp at about 365 nm wavelength for about 1 minute. After the photocuring process, a thermal curing process was performed to the sample at a temperature of about 120° C. for about 30 minutes.

Example 4

3-glycidoxypropyltrimethoxysilane (GPTMS, Gelest Company):diphenylsilanediol (DPSD, Gelest Company) were mixed at a ratio of 11.82 g:10.82 g (0.05 mol:0.05 mol) and then put into a 100 ml 2-neck flask. Thereafter, 0.02 g (0.1 mol % based on silane) of barium hydroxide as a catalyst was added to the mixture and stirred at about 80° C. for about 4 hours under $N_2$ (nitrogen) purge. A resin obtained after a sol-gel reaction for about 4 hours was filtered by using a 0.45 μm Teflon filter and an epoxy siloxane resin was obtained. Then, 3,4-epoxycyclohexylmethyl 3,4-epoxycyclohexane carboxylate was added in about 15 parts by weight based on the resin, and a diphenyldiodonium hexafluoroantimonium salt as a photo initiator for photo-cationic polymerization was added in about 2.0 parts by weight based on the mixed resin. Thereafter, 4,4'-thiobis(6-tert-butyl-m-cresol) as an antioxidant for suppressing an oxidation reaction caused by the photo initiator was added in about 2.0 parts by weight based on the resin. After stirring for about 3 hours, a sample was photocured by being exposed to a UV lamp at about 365 nm wavelength for about 1 minute. After the photocuring process, a thermal curing process was performed to the sample at a temperature of about 120° C. for about 30 minutes.

Example 5

24.63 g (0.1 mol) of 2-(3,4-epoxycyclohexyl)ethyltrimethoxysilane (ECTMS, Gelest Company) was put into a 100 ml 1-neck flask. Thereafter, 2.7 g of water was added thereto, and 1 g of Amberite IPA-400(Cl) (Aldrich Company) as a catalyst was added thereto, followed by stirring at about 80° C. for about 24 hours under reflux. Water and methanol were removed from a resin obtained after a sol-gel reaction for about 24 hours by using a reduced pressure evaporator at a pressure of about –0.1 MPa and a temperature of about 60° C. Thereafter, the resin was filtered by using a 0.45 μm Teflon filter and an alicyclic epoxy siloxane resin was obtained. Then, 3-ethyl-3-[[3-ethyloxetane-3-yl]methoxy]methyl]oxetane was added in 20 parts by weight based on the resin, and an arylsulfonium hexafluoroantimonium salt as a photo initiator for photo-cationic polymerization was added in 1.2 parts by weight based on the mixed resin. Thereafter, isooctyl-3-(3,5-di-tert-butyl-4-hydroxyphenyl)propionate and tris(nonylphenyl)phosphite as antioxidants for suppressing an oxidation reaction caused by the photo initiator were added in about 1.0 parts by weight and about 2.4 parts by weight, respectively, based on the resin. After stirring for about 3 hours, a sample was photocured by being exposed to a UV lamp at about 365 nm wavelength for about 1 minute. After the photocuring process, a thermal curing process was performed to the sample at a temperature of about 120° C. for about 30 minutes.

Example 6

23.63 g (0.1 mol) of 3-glycidoxypropyltrimethoxysilane (GPTMS, Gelest Company) was put into a 100 ml 1-neck flask. Thereafter, 2.7 g of water was added thereto, and 1 g of Amberite IPA-400(Cl) (Aldrich Company) as a catalyst was added thereto, followed by stirring at about 80° C. for about 24 hours under reflux. Water and methanol were removed from a resin obtained after a sol-gel reaction for about 24 hours by using a reduced pressure evaporator at a pressure of about –0.1 MPa and a temperature of about 60° C. Thereafter, the resin was filtered by using a 0.45 μm Teflon filter and an epoxy siloxane resin was obtained. Then, 3,4-epoxycyclohexylmethyl 3,4-epoxycyclohexane carboxylate was added in about 15 parts by weight based on the resin, and a diphenyldiodonium hexafluoroantimonium salt as a photo initiator for photo-cationic polymerization was added in about 2.0 parts by weight based on the mixed resin. Thereafter, isotridecyl-3-(3,5-di-tert-butyl-4-hydroxyphenyl)propionate and triphenyl phosphite as antioxidants for suppressing an oxidation reaction caused by the photo initiator were added in about 0.8 parts by weight and about 2.0 parts by weight, respectively, based on the resin. After stirring for about 3 hours, a sample was photocured by being exposed to a UV lamp at about 365 nm wavelength for about 1 minute. After the photocuring process, a thermal curing process was performed to the sample at a temperature of about 120° C. for about 30 minutes.

Comparative Example 1

2-(3,4-epoxycyclohexyl)ethyltrimethoxysilane (ECTMS, Gelest Company):diphenylsilanediol (DPSD, Gelest Company) were mixed at a ratio of 12.32 g:10.82 g (0.05 mol:0.05 mol) and then put into a 100 ml 2-neck flask. Thereafter, 0.02 g (0.1 mol % based on silane) of barium hydroxide as a catalyst was added to the mixture and stirred at about 80° C. for about 4 hours under $N_2$ (nitrogen) purge. A resin obtained after a sol-gel reaction for about 4 hours was filtered by using a 0.45 μm Teflon filter and an alicyclic epoxy siloxane resin was obtained. Then, 3-ethyl-3[[3-ethyloxetan-3-yl]methoxy]methylloxetane was added in about 20 parts by weight based on the resin, and an arylsulfonium hexafluoroantimonium salt as a photo initiator for photo-cationic polymerization was added in about 1.2 parts by weight based on the mixed resin. After stirring for about 3 hours, a sample was photocured by being exposed to a UV lamp at about 365 nm wavelength for about 1 minute. After the photocuring process, a thermal curing process was performed to the sample at a temperature of about 120° C. for about 30 minutes.

Comparative Example 2

3-glycidoxypropyltrimethoxysilane (GPTMS, Gelest Company):diphenylsilanediol (DPSD, Gelest Company) were mixed at a ratio of 11.82 g:10.82 g (0.05 mol:0.05 mol) and then put into a 100 ml 2-neck flask. Thereafter, 0.02 g (0.1 mol % based on silane) of barium hydroxide as a catalyst was added to the mixture and stirred at about 80° C. for about 4 hours under $N_2$ (nitrogen) purge. A resin obtained after a sol-gel reaction for about 4 hours was filtered by using a 0.45 µm Teflon filter and an epoxy siloxane resin was obtained. Then, 3,4-epoxycyclohexylmethyl 3,4-epoxycyclohexane carboxylate was added in about 15 parts by weight based on the resin, and a diphenyldiodonium hexafluoroantimonium salt as a photo initiator for photo-cationic polymerization was added in about 2.0 parts by weight based on the mixed resin. After stirring for about 3 hours, a sample was photocured by being exposed to a UV lamp at about 365 nm wavelength for about 1 minute. After the photocuring process, a thermal curing process was performed to the sample at a temperature of about 120° C. for about 30 minutes.

Comparative Example 3

24.63 g (0.1 mol) of 2-(3,4-epoxycyclohexyl)ethyltrimethoxysilane (ECTMS, Gelest Company) was put into a 100 ml 1-neck flask. Thereafter, 2.7 g of water was added thereto, and 1 g of Amberite IPA-400(Cl) (Aldrich Company) as a catalyst was added thereto, followed by stirring at about 80° C. for about 24 hours under reflux. Water and methanol were removed from a resin obtained after a sol-gel reaction for about 24 hours by using a reduced pressure evaporator at a pressure of about −0.1 MPa and a temperature of about 60° C. Thereafter, the resin was filtered by using a 0.45 µm Teflon filter and an alicyclic epoxy siloxane resin was obtained. Then, 3-ethyl-3-[[3-ethyloxetane-3-yl]methoxy]methyl]oxetane was added in 20 parts by weight based on the resin, and an arylsulfonium hexafluoroantimonium salt as a photo initiator for photo-cationic polymerization was added in 1.2 parts by weight based on the mixed resin. After stirring for about 3 hours, a sample was photocured by being exposed to a UV lamp at about 365 nm wavelength for about 1 minute. After the photocuring process, a thermal curing process was performed to the sample at a temperature of about 120° C. for about 30 minutes.

Comparative Example 4

23.63 g (0.1 mol) of 3-glycidoxypropyltrimethoxysilane (GPTMS, Gelest Company) was put into a 100 ml 1-neck flask. Thereafter, 2.7 g of water was added thereto, and 1 g of Amberite IPA-400(Cl) (Aldrich Company) as a catalyst was added thereto, followed by stirring at about 80° C. for about 24 hours under reflux. Water and methanol were removed from a resin obtained after a sol-gel reaction for about 24 hours by using a reduced pressure evaporator at a pressure of about −0.1 MPa and a temperature of about 60° C. Thereafter, the resin was filtered by using a 0.45 µm Teflon filter and an epoxy siloxane resin was obtained. Then, 3,4-epoxycyclohexylmethyl 3,4-epoxycyclohexane carboxylate was added in about 15 parts by weight based on the resin, and a diphenyldiodonium hexafluoroantimonium salt as a photo initiator for photo-cationic polymerization was added in about 2.0 parts by weight based on the mixed resin. After stirring for about 3 hours, a sample was photocured by being exposed to a UV lamp at about 365 nm wavelength for about 1 minute. After the photocuring process, a thermal curing process was performed to the sample at a temperature of about 120° C. for about 30 minutes.

Comparative Example 5

3-ethyl-3-[[3-ethyloxetane-3-yl]methoxy]methyl]oxetane was added in about 20 parts by weight based on a resin to 3,4-epoxycyclohexylmethyl 3,4-epoxycyclohexane carboxylate, and arylsulfonium hexafluoroantimonium salt as a photo initiator for photo-cationic polymerization was added in 1.2 parts by weight based on the mixed resin. Then, iso-octyl-3-(3,5-di-tert-butyl-4-hydroxyphenyl)propionate and tris(nonylphenyl)phosphite as antioxidants for suppressing an oxidation reaction caused by the photo initiator were added in about 1.35 parts by weight and about 3.6 parts by weight, respectively, based on the resin. After stirring for about 3 hours, a sample was photocured by being exposed to a UV lamp at about 365 nm wavelength for about 1 minute. After the photocuring process, a thermal curing process was performed to the sample at a temperature of about 120° C. for about 30 minutes.

Comparative Example 6

A diphenyldiodonium hexafluoroantimonium salt as a photo initiator for photo-cationic polymerization was added in about 2.0 parts by weight based on an epoxy resin to 3,4-epoxycyclohexylmethyl 3,4-epoxycyclohexane carboxylate. Then, isotridecyl-3-(3,5-di-tert-butyl-4-hydroxyphenyl)propionate and triphenyl phosphite as antioxidants for suppressing an oxidation reaction caused by the photo initiator were added in about 1.2 parts by weight and about 3.0 parts by weight, respectively, based on the resin. After stirring for about 3 hours, a sample was photocured by being exposed to a UV lamp at about 365 nm wavelength for about 1 minute. After the photocuring process, a thermal curing process was performed to the sample at a temperature of about 120° C. for about 30 minutes.

Experimental Example

Each of samples obtained from the above examples and comparative examples was evaluated by the following methods, and the results thereof were shown in [Table 1].
(a) Light-Transmittance
A light-transmittance was measured at a wavelength of about 450 nm by using a UV/VIS/NIR spectrum analyzer (UV-3101PC) of Shimadzu Corporation.
(b) Refractive Index
A refractive index was measured at a wavelength of about 633 nm by using a prism coupler (Metricon 2010, Pennington).
(c) Thermal Resistance
After a sample was put into an oven at about 120° C. for about 1000 hours, a light-transmittance was measured at a wavelength of about 450 nm.

(d) Hardness

A hardness was measured by using a Shore hardness tester (HPSD, Schmidt), and the result thereof was denoted as Shore D hardness.

TABLE 1

|  | Ex. 1 | Ex. 2 | Ex. 3 | Ex. 4 | Ex. 5 | Ex. 6 | Com. ex. 1 | Com. ex. 2 | Com. ex. 3 | Com. ex. 4 | Com. ex. 5 | Com. ex. 6 |
| --- | --- | --- | --- | --- | --- | --- | --- | --- | --- | --- | --- | --- |
| Light transmittance | 88.6 | 89.0 | 87.0 | 87.5 | 90.4 | 90.1 | 89.0 | 87.2 | 90.5 | 90.0 | 86.3 | 85.7 |
| Thermal resistance (Light transmittance after 1000 hours) | 87.8 | 86.5 | 86.2 | 85.4 | 88.8 | 87.6 | 54.3 | 51.2 | 59.2 | 57.8 | 44.3 | 42.8 |
| Refractive index | 1.54 | 1.54 | 1.54 | 1.54 | 1.51 | 1.50 | 1.54 | 1.54 | 1.51 | 1.51 | 1.49 | 1.50 |
| Hardness | 80 | 80 | 75 | 75 | 75 | 70 | 80 | 75 | 75 | 70 | 80 | 80 |

Examples 1 to 6 show an initial light-transmittance, a light-transmittance after a thermal treatment at about 120° C. for about 1000 hours under air atmosphere, a refractive index, and a hardness of cured transparent siloxane produced by photo-cationically polymerizing a thermally resistant optical siloxane resin composition including a mixture of siloxane containing epoxy group produced through a sol-gel reaction, a photo initiator for photo-cationic polymerization, and an antioxidant. Further, Comparative examples 1 to 4 show an initial light-transmittance, a light-transmittance after a thermal treatment at about 120° C. for about 1000 hours under air atmosphere, a refractive index, and a hardness of cured transparent siloxane produced by photo-cationically polymerizing a resin including a mixture of siloxane containing epoxy group produced through a sol-gel reaction and a photo initiator for photo-cationic polymerization. Comparative examples 5 and 6 show an initial light-transmittance, a light-transmittance after a thermal treatment at about 120° C. for about 1000 hours under air atmosphere, a refractive index, and a hardness of an epoxy polymer produced by photo-cationically polymerizing a resin including a mixture of a commercial epoxy monomer, a photo initiator for photo-cationic polymerization, and an antioxidant. As can be seen from the results of Examples 1 to 6, the light-transmittance of the cured transparent siloxane produced by photo-cationically polymerizing a thermally resistant optical siloxane resin composition including a mixture of siloxane containing epoxy group produced through a sol-gel reaction, a photo initiator for photo-cationic polymerization, and an antioxidant was scarcely changed after the thermal treatment at about 120° C. for about 1000 hours under air atmosphere. Meanwhile, from Comparative examples 1 to 4 where an antioxidant was not added, it can be seen that the light-transmittance of the cured transparent siloxane was sharply decreased after the thermal treatment at about 120° C. for about 1000 hours under air atmosphere. It was caused by an oxidation reaction of hydrocarbon in the cured transparent siloxane due to free radicals generated from the photo initiator for photo-cationic polymerization. In comparison between the thermal resistance of Examples 1 to 6 and that of Comparative examples 5 and 6, it can be seen that the light-transmittance of the epoxy polymer produced by photo-cationically polymerizing a resin including a mixture of a commercial epoxy monomer, a photo initiator for photo-cationic polymerization, and an antioxidant was sharply decreased after the thermal treatment at about 120° C. for about 1000 hours under air atmosphere due to non-existence of a siloxane bond having a high thermal resistance to yellowing. These two comparison results mean that it is possible to produce cured transparent siloxane having a high thermal resistance to yellowing with a combination of siloxane containing epoxy group produced through the sol-gel reaction with a photo initiator and an antioxidant. In comparison between the refractive index and the hardness of Examples 1 to 6 and those of Comparative examples 1 to 4, it can be seen that the hardness or the refractive index was not changed depending on whether an antioxidant was added or not. The cured transparent siloxane produced by photo-cationically polymerizing the thermally resistant optical siloxane resin composition of the present disclosure has a high refractive index of about 1.50 or more and a high hardness of about 70 or more which are suitable characteristics for application to the optical field and the display field.

The above description of the present disclosure is provided for the purpose of illustration, and it would be understood by those skilled in the art that various changes and modifications may be made without changing technical conception and essential features of the present disclosure.

What is claimed is:

1. A thermally resistant optical siloxane resin composition comprising:
   siloxane containing photo-cationically polymerizable epoxy group; a photo initiator; and an antioxidant,
   wherein the antioxidant is selected from the group consisting of a phenolic-based antioxidant, a phosphate-based antioxidant, an aminic-based antioxidant, a thioester-based antioxidant, and combinations thereof,
   when the composition is used in the producing cured transparent siloxane, in the cured transparent siloxane has a Shore D hardness of 70 or more,
   wherein at least 97% of a light-transmittance of the cured transparent siloxane is maintained after a thermal treatment of 1000 hours.

2. The thermally resistant optical siloxane resin composition of claim 1,
   wherein the siloxane containing photo-cationically polymerizable epoxy group is produced through a sol-gel reaction.

3. The thermally resistant optical siloxane resin composition of claim 2,
   wherein the siloxane containing photo-cationically polymerizable epoxy group is produced through a sol-gel reaction of alkoxysilane containing an epoxy group.

4. The thermally resistant optical siloxane resin composition of claim 2,
   wherein the siloxane containing photo-cationically polymerizable epoxy group is produced through a sol-gel reaction between alkoxysilane or silanol and alkoxysilane containing epoxy group.

5. The thermally resistant optical siloxane resin composition of claim 3,
wherein the alkoxysilane containing epoxy group includes a structure represented by [Chemical formula 1]:

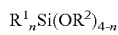 [Chemical formula 1]

wherein $R_1$ denotes an epoxy group or an alicyclic epoxy group; $R^2$ denotes a linear or branched ($C_1$ to $C_7$)alkyl group; and n denotes an integer of 1 to 3.

6. The thermally resistant optical siloxane resin composition of claim 4,
wherein the alkoxysilane or silanol includes a structure represented by [Chemical formula 2]:

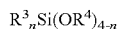 [Chemical formula 2]

wherein $R^3$ denotes ($C_1$ to $C_{20}$)alkyl group, ($C_2$ to $C_{20}$) alkenyl group, ($C_2$ to $C_{20}$)alkinyl group or ($C_6$ to $C_{20}$) aryl group which may have a substituent selected from Group A; $R^4$ denotes linear or branched ($C_1$ to $C_7$)alkyl group or hydrogen; and n denotes an integer of 1 to 3:
<Group A>
($C_1$ to $C_{20}$)alkyl group, ($C_3$ to $C_8$)cycloalkyl group, acryl group, methacryl group, allyl group, halogen group, amino group, mercapto group, ether group, ester group, ($C_1$ to $C_{20}$)alkoxy group, sulfone group, nitro group, hydroxy group, cyclobutene group, carbonyl group, carboxylic group, alkyd group, urethane group, vinyl group, nitrile group, oxetane group, phenyl group, and combinations thereof.

7. The thermally resistant optical siloxane resin composition of claim 1,
wherein the photo initiator includes an onium salt and/or an organometallic salt.

8. The thermally resistant optical siloxane resin composition of claim 2,
wherein the sol-gel reaction is performed with a catalyst selected from the group consisting of an acidic catalyst, a basic catalyst, an ion exchange resin, metal hydroxide catalyst, and combinations thereof.

9. The thermally resistant optical siloxane resin composition of claim 1, further including:
a monomer containing photo-cationically polymerizable functional group.

10. A method for producing cured transparent siloxane, the method comprising:
photo-cationic polymerization of a thermally resistant optical siloxane resin composition of claim 1,
wherein the cured transparent siloxane has Shore D hardness of 70 or more,
wherein at least 97% of a light-transmittance of the cured transparent siloxane is maintained after a thermal treatment of 1000 hours.

11. The method of claim 10, further including:
a thermal treatment after the photo-cationic polymerization.

12. Cured transparent siloxane produced by a method of claim 10.

13. The composition of claim 1, wherein the cured transparent siloxane has a hardness of 75 or more.

14. The composition of claim 1, wherein the cured transparent siloxane has a hardness of 80 or more.

15. The method of claim 10, wherein the cured transparent siloxane has a hardness of 75 or more.

16. The method of claim 10, wherein the cured transparent siloxane has a hardness of 80 or more.

17. The thermally resistant optical siloxane resin composition of claim 1, wherein the thermal treatment of 1000 hours is performed at 120° C.

18. The method of claim 10, wherein the thermal treatment of 1000 hours is performed at 120° C.

* * * * *